United States Patent
Matyac

(10) Patent No.: US 11,929,637 B2
(45) Date of Patent: Mar. 12, 2024

(54) METER-BASED TRANSFER SWITCH WITH LOCKOUT

(71) Applicant: Mark Matyac, Lawrenceville, GA (US)

(72) Inventor: Mark Matyac, Lawrenceville, GA (US)

(73) Assignee: North American Power Products, Inc., Lawrenceville, GA (US)

( * ) Notice: Subject to any disclaimer, the term of this patent is extended or adjusted under 35 U.S.C. 154(b) by 184 days.

(21) Appl. No.: 17/319,544

(22) PCT Filed: Sep. 9, 2020

(86) PCT No.: PCT/US2020/049810
§ 371 (c)(1),
(2) Date: May 13, 2021

(87) PCT Pub. No.: WO2021/050457
PCT Pub. Date: Mar. 18, 2021

(65) Prior Publication Data
US 2022/0200326 A1   Jun. 23, 2022

Related U.S. Application Data

(63) Continuation-in-part of application No. 16/599,826, filed on Oct. 11, 2019, now Pat. No. 11,031,782, which is a continuation-in-part of application No. 15/825,644, filed on Nov. 29, 2017, now Pat. No. 10,498,166.

(60) Provisional application No. 62/897,752, filed on Sep. 9, 2019.

(51) Int. Cl.
*H01H 9/26* (2006.01)
*G01R 22/06* (2006.01)
*H01H 9/00* (2006.01)
*H02J 9/06* (2006.01)

(52) U.S. Cl.
CPC .............. *H02J 9/06* (2013.01); *G01R 22/065* (2013.01); *H01H 9/00* (2013.01); *H01H 9/26* (2013.01)

(58) Field of Classification Search
CPC .......... H02J 9/06; H02J 9/062; G01R 22/065; H01H 9/00; H01H 9/26; H01H 71/1009; Y02B 10/70; Y02B 70/30; Y02B 70/3225; Y02B 90/20; Y02E 10/56; Y02E 10/76; Y02E 60/00; Y04S 20/12; Y04S 20/222; Y04S 20/242; Y04S 20/248; Y04S 40/121
See application file for complete search history.

(56) References Cited

U.S. PATENT DOCUMENTS 10,879,727 B1 * 12/2020 Cooper ................. H02J 9/062
2019/0304714 A1 * 10/2019 Yang ..................... H01H 9/286
(Continued)

*Primary Examiner* — Ahmed M Saeed
(74) *Attorney, Agent, or Firm* — Bryan W. Bockhop; Bockhop Intellectual Property Law, LLC

(57) ABSTRACT

An intermediate disconnect section includes a utility power breaker and an alternate power breaker. A switching mechanism opens and closes the utility power breaker and the alternate power breaker, so as to be in one of a first, second or third state. The utility power breaker is closed and the alternate power breaker is open while in the first state. The utility power breaker is open and the alternate power breaker is closed while in the second state. The utility power breaker is open and the alternate power breaker is open while in the third state.

18 Claims, 9 Drawing Sheets

(56) References Cited

U.S. PATENT DOCUMENTS

2020/0209293 A1\* 7/2020 Teboulle ............... H02H 1/0007
2021/0159030 A1\* 5/2021 Dominguez ............. H01H 9/28

\* cited by examiner

METER-BASED TRANSFER SWITCH WITH LOCKOUT

CROSS-REFERENCE TO RELATED APPLICATION(S)

This application is a US National Phase continuation-in-part application of, and claims the benefit of, PCT/US20/49810, filed Sep. 9, 2020, which is an international PCT application of U.S. Provisional Patent Application Ser. No. 62/897,752, filed Sep. 9, 2019, the entirety of each of which is hereby incorporated herein by reference. This application also claims the benefit of U.S. patent application Ser. No. 16/599,826, filed on Oct. 11, 2019, which is a continuation-in-part of U.S. patent application Ser. No. 15/825,644, filed on Nov. 29, 2017 and now issued as U.S. Pat. No. 10,498,166, the entirety of each of which is hereby incorporated herein by reference.

BACKGROUND OF THE INVENTION

1. Field of the Invention

The present invention relates to electric power systems and, more specifically, to a device that is coupled to an electric power meter.

2. Description of the Related Art

As shown in FIG. 1A, a typical existing meter base 10, used for electrically coupling power from a two-phase power source (e.g., a first 120V AC "A-"phase and a second 120V AC "B-"phase that is out of phase with the first 120V AC phase) to a load (such as an electrical distribution system in a building) typically includes four sockets 14. A first socket 14 is coupled to the A-phase S120A wire from the source (which can be from the power grid or from an alternate source) and a second socket 14 is coupled to the B-phase S120B wire from the source. A neutral hub N is coupled to the neutral wire from the source (which, in some embodiments, is coupled to a ground). A third socket 14 is coupled to the A-phase L120A wire to the load and a fourth socket 14 is coupled to the B-phase L120B wire to the load. Typically, the wires to the load go through a knock-out hole 12 that is in communication with a hole in an exterior wall of a building. The wires from the source are contained in a conduit 19 coming from the source.

As shown in FIG. 1B, a typical existing electricity meter includes four plugs 16 that are complimentary in shape to the sockets 14 and that couple the above-described wires to an electricity meter, which measures consumption of electricity flowing from the source through the load. The meter includes an electrical measuring and display unit 18 (see FIG. 3A) for measuring electrical consumption, which is typically covered with a clear plastic protector 21.

With increased use of electronic devices there comes an increased risk of damage to such devices as a result of electrical surges (e.g., from lightning and power transients). To remedy this, some users plug all of their electronic devices into local surge suppressors. However, local surge suppressors can be bulky and seen as unsightly. Some users install surge suppressors into the breaker panels in their buildings. However, such installations can be time consuming, especially for multi-panel buildings such as office buildings and apartment complexes.

Also, powered electrical distribution systems can give rise to hazards during certain situations, such as when firefighters have to spray water into burning buildings—in which wires may be exposed—while fighting fires. In such emergency situations, finding a disconnect switch for an entire electrical distribution system can be difficult for emergency personnel. This can be especially problematic when the load distribution system can be powered by both a utility grid power source and an alternate power source.

Therefore, there is a need for a device that provides an easy installation of a surge suppressor and an electrical disconnect switch that is easy to find and operate.

There is also a need for a device that quickly isolates both a grid power source and an alternate power source from a load.

SUMMARY OF THE INVENTION

The disadvantages of the prior art are overcome by the present invention which, in one aspect, is an intermediate disconnect section for mounting on a meter base having a source connector and a load connector. The intermediate section is adapted for mounting of an electricity meter having a source connection couplable to the source connector and a load connection couplable to the load connector. The intermediate section includes a platform. A first source coupling is mounted on the platform and is adapted to be electrically coupled to the source connector of the meter base. A second source coupling is mounted on the platform and is adapted to be electrically coupled to the source connection of the electricity meter. A first load coupling is mounted on the platform and is adapted to be electrically coupled to the load connector of the meter base. A second load coupling is mounted on the platform and is adapted to be electrically coupled to the load connection of the electricity meter and electrically coupled to the first load coupling. A switch is mounted on the platform and is adapted selectively to couple and decouple the first source coupling to and from the second source coupling. A switching mechanism is configured to open and close the switch. The switching mechanism includes a device that is external to the platform that allows a user to open and close the switch manually.

In another aspect, the invention is an intermediate section for mounting on a meter base having a source connector. The source connector includes a neutral coupling, and a load connector. The intermediate section is adapted for mounting of an electricity meter having a source connection couplable to the source connector and a load connection couplable to the load connector. The intermediate section includes a platform. A first source coupling is mounted on the platform and is adapted to be electrically coupled to the source connector of the meter base. A second source coupling is mounted on the platform and is adapted to be electrically coupled to the source connection of the electricity meter. A first load coupling is mounted on the platform and is adapted to be electrically coupled to the load connector of the meter base. A second load coupling is mounted on the platform and is adapted to be electrically coupled to the load connection of the electricity meter and electrically coupled to the first load coupling. A surge suppressor is mounted on the platform and is electrically coupled to a neutral coupling and to the first load coupling.

In another aspect, the invention is an electricity meter system that includes a meter base having a source connector electrically coupled to a power source and a load connector electrically coupled to a load and an electricity meter having a source connection couplable to the source connector and a load connection couplable to the load connector. An intermediate disconnect section includes: a platform; a first source coupling mounted on the platform and adapted to be electrically coupled to the source connector of the meter base; a second source coupling mounted on the platform and adapted to be electrically coupled to the source connection of the electricity meter; a first load coupling mounted on the platform and adapted to be electrically coupled to the load connector of the meter base; a second load coupling mounted on the platform and adapted to be electrically coupled to the load connection of the electricity meter and electrically coupled to the first load coupling; a switch mounted on the platform and adapted to couple and decouple the first source coupling to and from the second source coupling; and a switching mechanism that is configured to open and close the switch and that includes a device that is external to the platform that allows a user to open and close the switch manually.

In another aspect, the invention is an intermediate disconnect section mountable on a meter base having a source connector coupled to a load. The intermediate disconnect section is configured to receive a meter and is for use with a utility power source and an alternate power source. The intermediate disconnect section includes a utility power breaker having a closed state in which the utility power source is coupled to the source connector of the meter base through the meter and an open state in which the utility power source decoupled from the source connector of the meter base. An alternate power breaker has a closed state in which the alternate power source is coupled to the source connector of the meter base. A switching mechanism selectively opens and closes the utility power breaker and selectively opens and closes the alternate power breaker, so as to be in exactly one of a first state, a second state or a third state. The utility power breaker is closed and the alternate power breaker is open while in the first state. The utility power breaker is open and the alternate power breaker is closed while in the second state. The utility power breaker is open and the alternate power breaker is open while in the third state.

In another aspect, the invention is an intermediate disconnect section mountable on a meter base having a source connector coupled to a load. The intermediate disconnect section is configured to receive a meter and is configured for use with a utility power source and an alternate power source. The intermediate disconnect section includes a utility power breaker having a closed state in which the utility power source is coupled to the source connector of the meter base through the meter and an open state in which the utility power source decoupled from the source connector of the meter base. An alternate power breaker has a closed state in which the alternate power source is coupled to the source connector of the meter base. A switching mechanism selectively opens and closes the utility power breaker and selectively opens and closes the alternate power breaker, so as to be in exactly one of a first state, a second state or a third state. The utility power breaker is closed and the alternate power breaker is open while in the first state. The utility power breaker is open and the alternate power breaker is closed while in the second state. The utility power breaker is open and the alternate power breaker is open while in the third state. A frame supports the utility power breaker, the alternate power breaker, the rack and the pinion. A rod extends from the switching mechanism and supports a lever. A locking device secures the lever when the locking mechanism is in the third state. The lever has an elongated portion that defines a lever opening having an opening width and running along a length of the elongated portion so as to be bounded by two oppositely-disposed walls. Each of the two oppositely-disposed walls defines a hole passing therethrough in which the holes are aligned with each other. The locking device includes a key hingedly attached to the frame. The key has an end portion that has a key width that is narrower than the opening width. The key is positioned so that the end portion is rotatable so as to extend outwardly through the lever opening when the lever is in the off position. A pin passes through the holes so as to keep the key extended outwardly through the lever opening, thereby preventing the lever from exiting the off position.

In yet another aspect, the invention is an intermediate disconnect section mountable on a meter base having a source connector coupled to a load. The intermediate disconnect section is configured to receive a meter and is for use with a utility power source and an alternate power source. The intermediate disconnect section includes a utility power breaker having a closed state in which the utility power source is coupled to the source connector of the meter base through the meter and an open state in which the utility power source decoupled from the source connector of the meter base. An alternate power breaker has a closed state in which the alternate power source is coupled to the source connector of the meter base. A switching mechanism selectively opens and closes the utility power breaker and selectively opens and closes the alternate power breaker, so as to be in exactly one of a first state, a second state or a third state. The utility power breaker is closed and the alternate power breaker is open while in the first state. The utility power breaker is open and the alternate power breaker is closed while in the second state. The utility power breaker is open and the alternate power breaker is open while in the third state. The switching mechanism includes a rack that is coupled to both the utility power breaker and the alternate power breaker. The rack having a first position in which the switching mechanism is in the first state, a second position in which the switching mechanism is in the second state, and a third position in which the switching mechanism is in the third state. A pinion is engaged with the rack. The pinion causes the rack to move to one of the first position, the second position and the third position. A lever is coupled to the pinon and causes the pinon to rotate in response to a force applied thereto. The lever has a utility position that places the rack in the first position, an alternate source position that places the rack in the second position, and an off position that places the rack in the third position.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 7D is a perspective view of an intermediate disconnect section.

DETAILED DESCRIPTION OF THE INVENTION

Figure 1A:
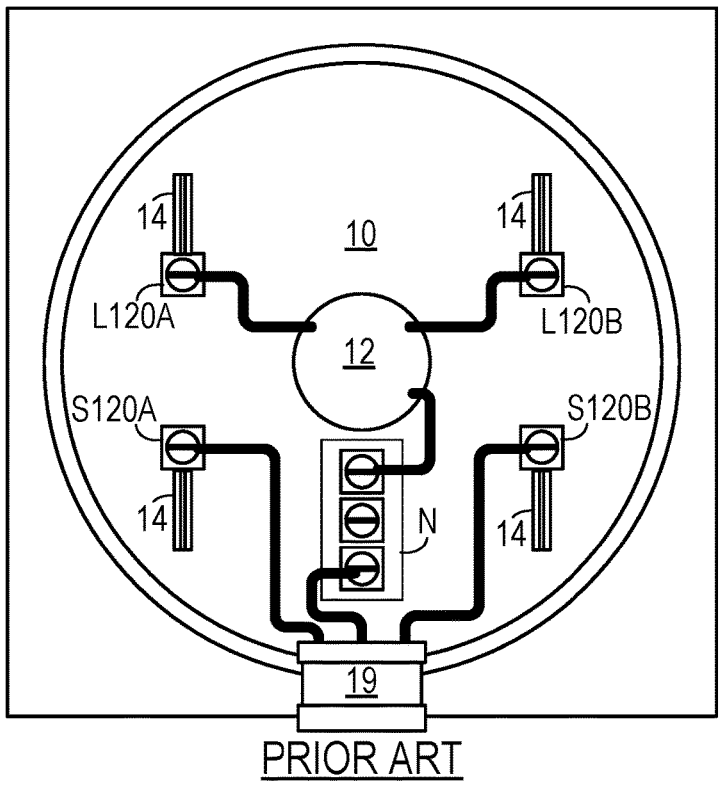
FIG. 1A is a schematic diagram of a prior art meter base wired to receive power from a power source and to provide power to a load.
Figure 1B:
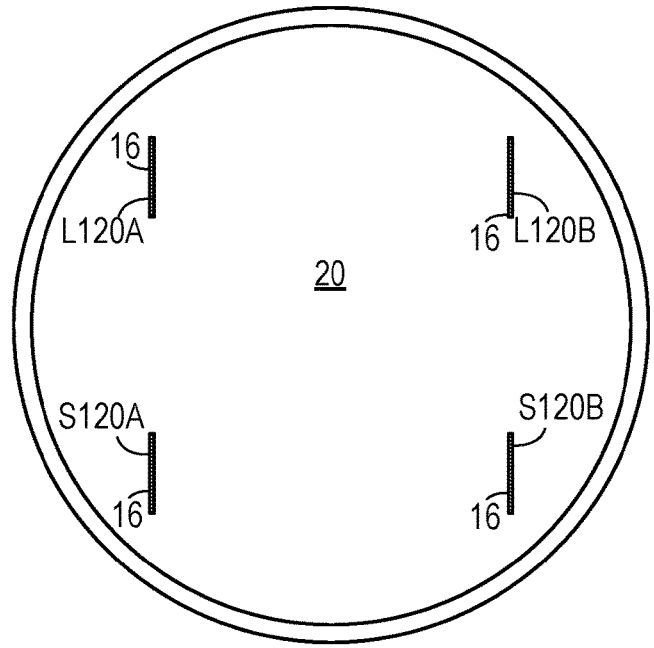
FIG. 1B is a schematic diagram of a bottom of a prior art electric meter of a type that is configured to be plugged into a meter base of the type shown in FIG. 1A.
Figure 2A:
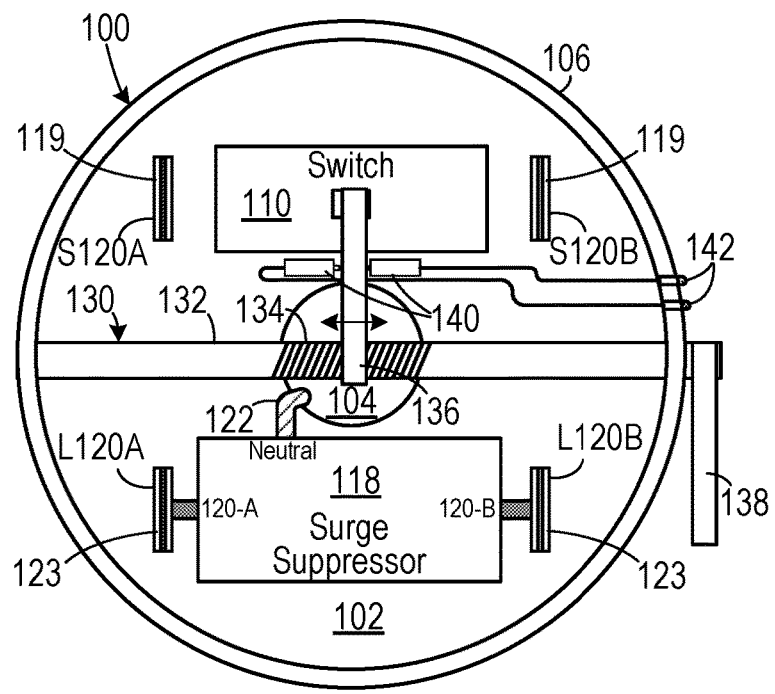
FIG. 2A is a schematic diagram of a top side plan view of one embodiment of an intermediate section that is configured to be coupled to electric meters, such as the type shown in FIG. 1B.
Figure 2B:
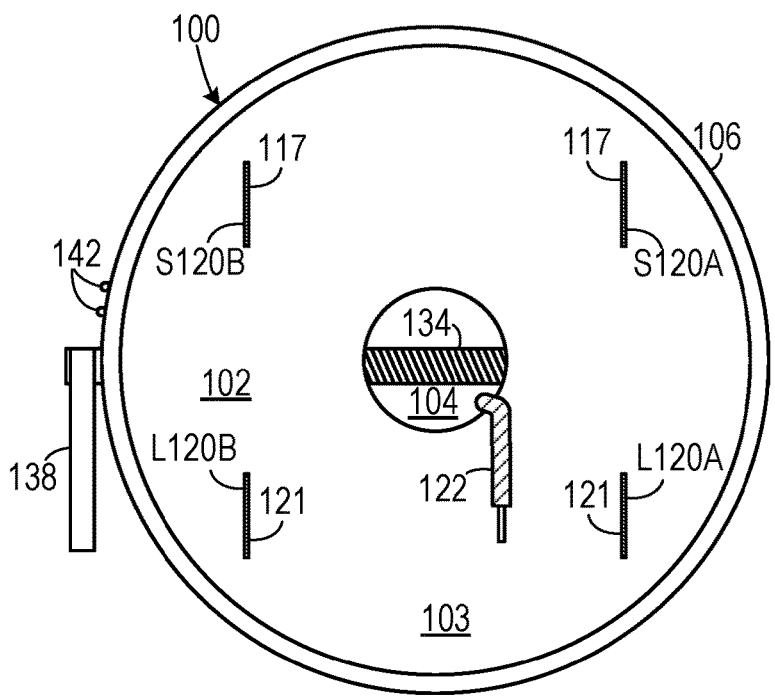
FIG. 2B is a schematic diagram of a bottom side plan view of the intermediate section shown in FIG. 2A that is configured to be plugged into a meter base of the type shown in FIG. 1A.
Figure 2C:
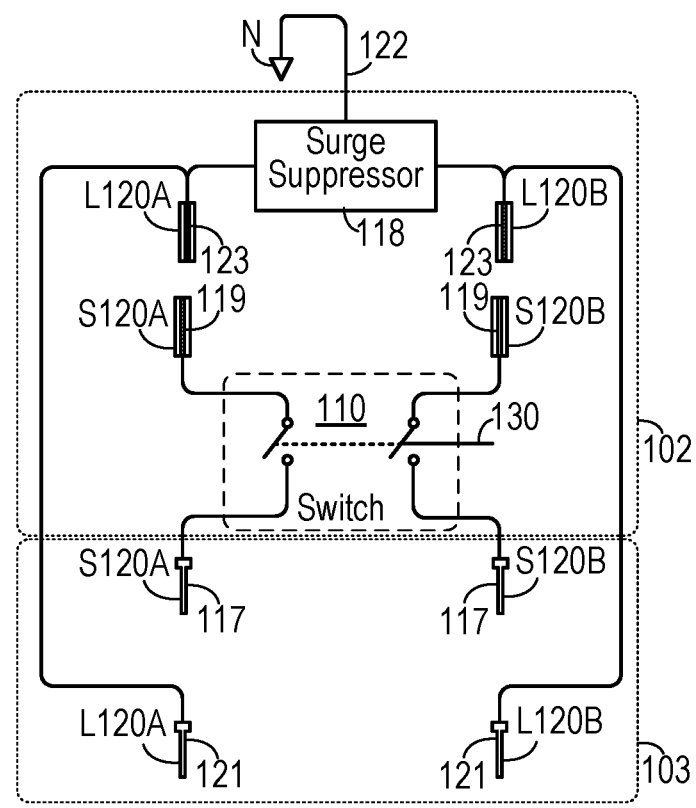
FIG. 2C is a wiring diagram of the intermediate section shown in FIGS. 2A and 2B.

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIGS. 2A-2C and FIGS. 3A and 3B, one embodiment of a socket based disconnect with surge protection includes an intermediate section 100 for installation between a meter base 10 (which may be affixed to an exterior wall 2) and an electricity meter 20. The intermediate section includes a platform 106 that is shaped so as to fit both the meter base 10 and the electricity meter 20, and is typically made from a non-conductive material, such as a plastic. Electrically, the intermediate section 100 includes a bottom side 103 with load plugs 121 (L120A and L120B) that can be plugged into the load sockets 14 of the meter base 10 and source plugs 117 (S120A and S120B) that can be plugged into the source sockets 14 of the meter base 10 (see, FIGS. 3A-3B). The top side 102 includes load sockets 123 (electrically L120A and L120B) and source sockets 119 (electrically S120A and S120B) into which load plugs 16 and source plugs 16 of the electricity meter 20 can be plugged (see, FIGS. 3A-3B). The load sockets 123 (L120A and L120B) on the top side 102 are electrically coupled to the load plugs 121 (electrically L120A and L120B) on the bottom side 103.

In terms of the physical coupling components, a first source coupling 117, including two plugs—each corresponding to a different phase (A and B) from the power source, is mounted on the bottom side 103 of the platform 106. A second source coupling 119, including two sockets, is mounted on the top side 102 of the platform 106 and is selectively coupled to the source connection of the electricity meter 20. The first source coupling 117 is selectively couplable to the second source coupling 119 via the switch 110. A first load coupling 121 is mounted on the bottom side 103 of the platform 106 and is electrically couplable the load connectors of the meter base 10. A second load coupling 123 is mounted on the top side 102 of the platform 106 and is electrically couplable to the load connection of the electricity meter 120 and is electrically coupled to the first load coupling 121.

The intermediate section 100 includes a switch 110 that is configured to couple (and decouple) the source sockets S120A and S120B on the top side 102 to (and from) the source plugs S120A and S120B on the bottom side 103 selectively. A manual mechanism 130 that includes an external handle 138 is used to open and close the switch 110. Thus, the intermediate section 100 provides a way to disconnect the load from the source by flipping the handle 138. This can provide first responders (such as firefighters) and utility workers to disconnect the wiring system of a building (i.e., the load) from the grid power supply (i.e., the source) or other power source quickly from the outside of the building. (In alternate embodiments, the switch 110 can be configured to connect and disconnect load sockets L120A and L120B on the top side 102 to (and from) the load plugs L120A and L120B on the bottom side 103.)

A surge suppressor 118 (also referred to as a "surge protector") is coupled to the load plugs L120A and L120B and a neutral wire 122 that is to be coupled to the neutral N of both the source and the load through a hole 104. The surge suppressor 118 is configured to provide surge protection to both phases of the load, irrespective of whether the source power is coupled to the load. (In alternate embodiments, the surge suppressor 118 can be coupled to the source plugs S120A and S120B instead of to the load.) In one embodiment, the surge suppressor 118 can include at least one metal oxide varistor (MOV).

In one embedment, the switch control mechanism 130 includes a rod 132 with a threaded portion 134 that engages a complimentarily-threaded lateral movement member 136 that imposes lateral motion onto the switch 110 so as to open it or close it when the rod 132 is rotated. A handle 138 is affixed to the rod 132, which allows one to rotate the rod 132, thereby moving the movement member 136 so that when the handle 138 is in a first position, the switch 110 is open and the source is isolated from the load. When the handle 138 has been rotated to a second position that is different from the first position, the switch 110 is closed and current can flow through the meter 20 to the load.

Figure 3A:
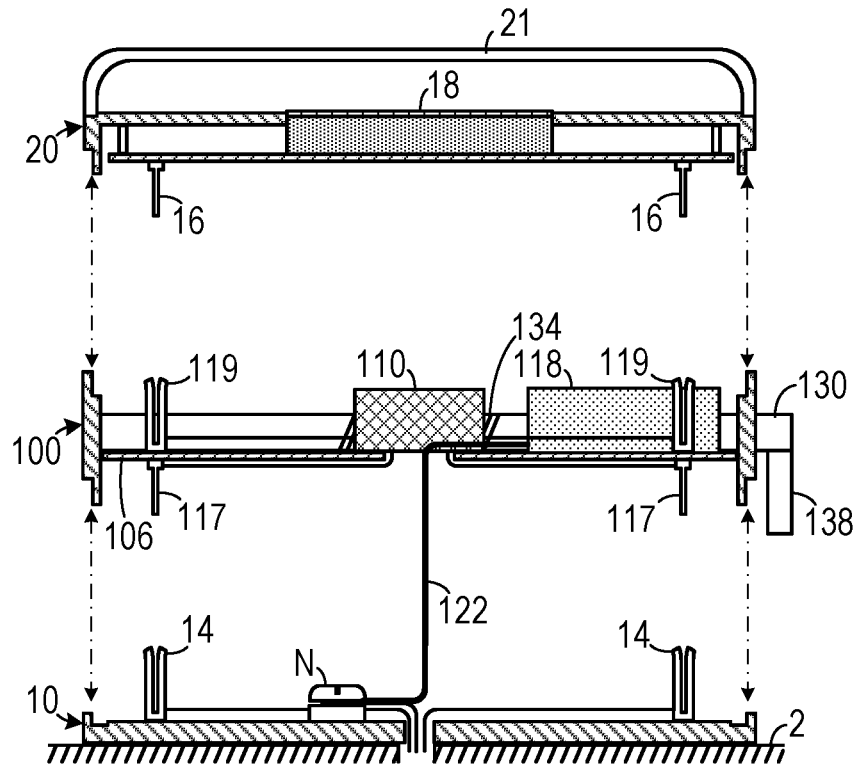
FIG. 3A is a side exploded view schematic diagram of a meter base, an intermediate section and an electric meter.
Figure 3B:
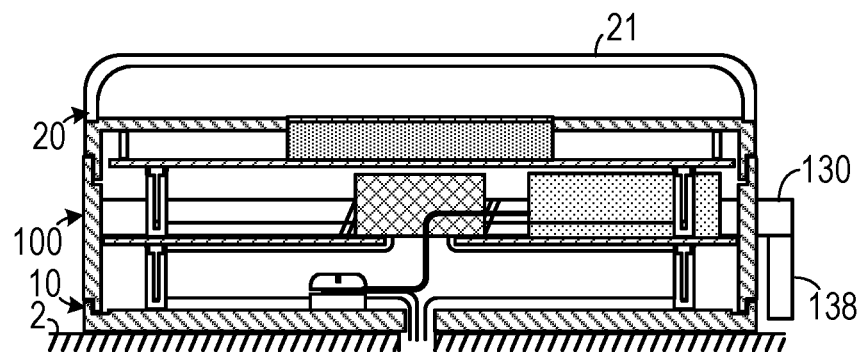
FIG. 3B is a side elevational view schematic diagram of the meter base, the intermediate section and the electric meter shown in FIG. 3A after installation.
Figure 4:
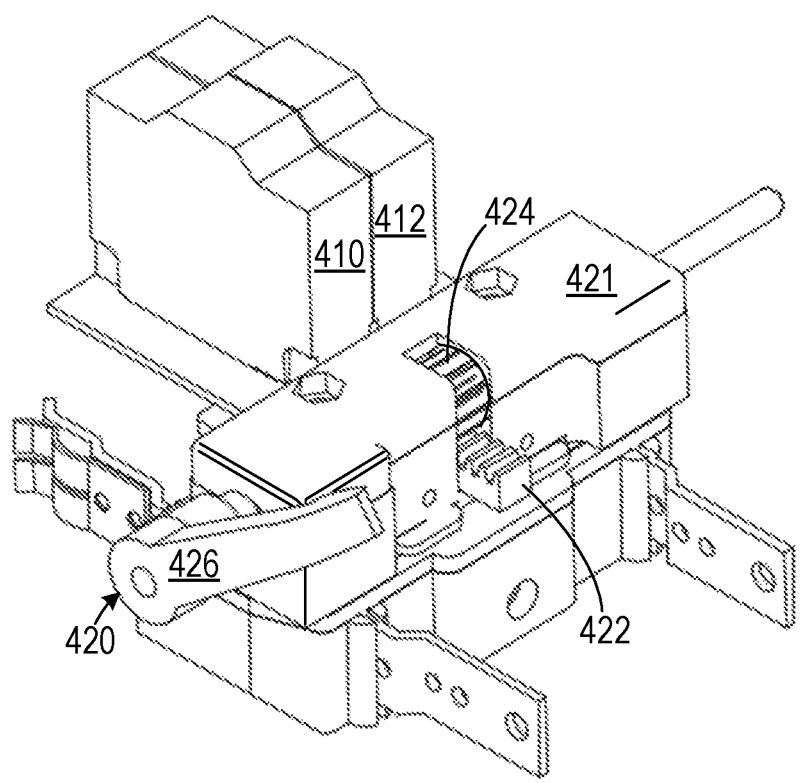
FIG. 4 is a perspective view of alternating disconnect system.

As can be seen in FIG. 3A, prior to installing the intermediate section 100, the neutral wire 122 is coupled to the neutral N lead for the system at the hub on the meter base 10. Then, as shown in FIG. 3B, the intermediate section 100 is plugged into the meter base 10 and the meter 20 is plugged into the intermediate section 100. Retaining rings (not shown) can then be installed to prevent unplugging of the meter 20 and the intermediate section 100 so as to prevent tampering and hazards. The platform 106 can be made of plastic and has a shape that is complementary to both the meter base 10 and the electricity meter 20 so as to be able to fit tightly between the two.

The invention has the advantage of allowing both a power disconnect and a surge suppressor to be installed quickly, simply by unplugging a meter from a meter base, plugging in an intermediate section into the meter base and plugging the meter into the intermediate section. Also, it is easy for electricians and emergency personnel to find the disconnect, because it is at the location of the meter.

Figure 5A:
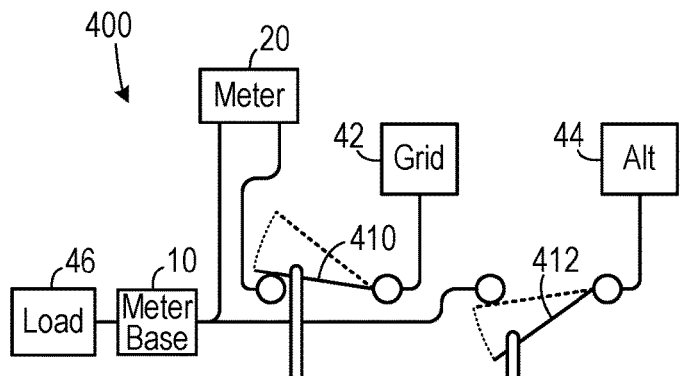
FIGS. 5A-5C are schematic diagrams of the alternating disconnect system in different states.
Figure 5B:
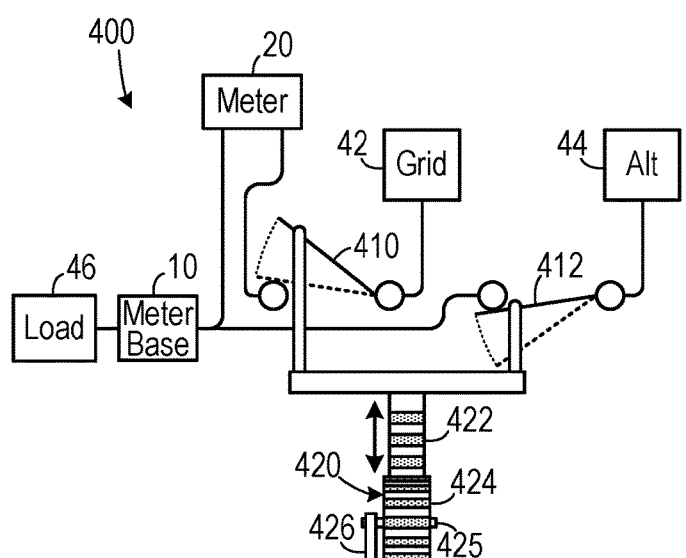
Figure 5C:
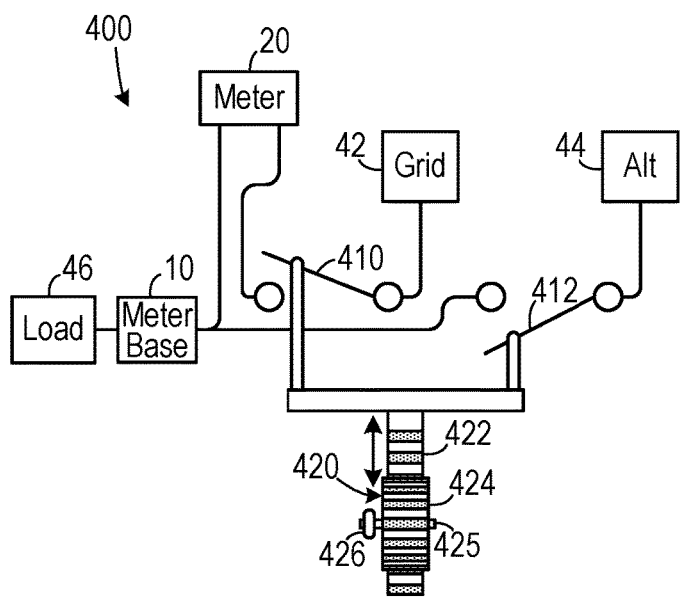

In one embodiment, as shown in FIGS. 4, 5A-5C, the intermediate section can include an alternating disconnect system 400 that selectively couples the load 46 exclusively to only one of the main power source 42 (e.g., the power grid), the alternate power source 44 (e.g., a solar or wind power source), or to neither source. The alternating disconnect system 400 includes a main utility power breaker 410 and an alternate power breaker 412, the states of both of which are controlled by a rack and pinion system 420. The rack and pinion system 420 includes a rack 422 that is mechanically coupled to the main utility power breaker 410 and the alternate power breaker 412. The rack 422 is enmeshed with a pinion gear 424 that is coupled to a handle 426 that is supported by a frame 421. Rotation of the handle 426 causes the rack 422 to move forward and backward. The rack 422 is mechanically coupled to the main power breaker 410 and the alternate power breaker 412 in such a way that when the main utility power breaker 410 is open, the alternate power breaker 412 is closed and when the main power breaker 410 is closed, the alternate power breaker 412 is open. Thus, when the rack 422 is pushed forward by the gear 424, the main power source 42 is disconnected from the load 46 and the alternate power source 44 is connected to the load 46; when the rack 422 is pulled backward by the gear 424, the main power source 42 is connected to the load 46 through the meter 20 and the alternate power source 44 is disconnected from the load 46. As shown in FIG. 5C, both the main power breaker 410 and the alternate power breaker 412 can have a central open position and the rack 422 can be positioned so that both are in the open position, thereby decoupling both the main power source 42 and alternate power source 44 from the load 46.

Figure 6A:
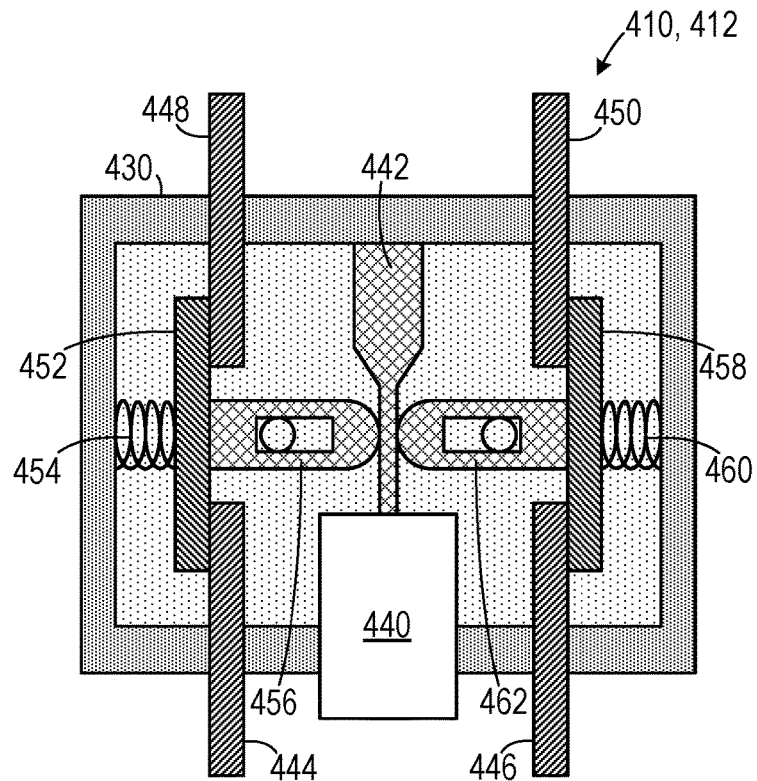
FIGS. 6A-6B are schematic diagrams of a grid relay switch in two different states.
Figure 6B:
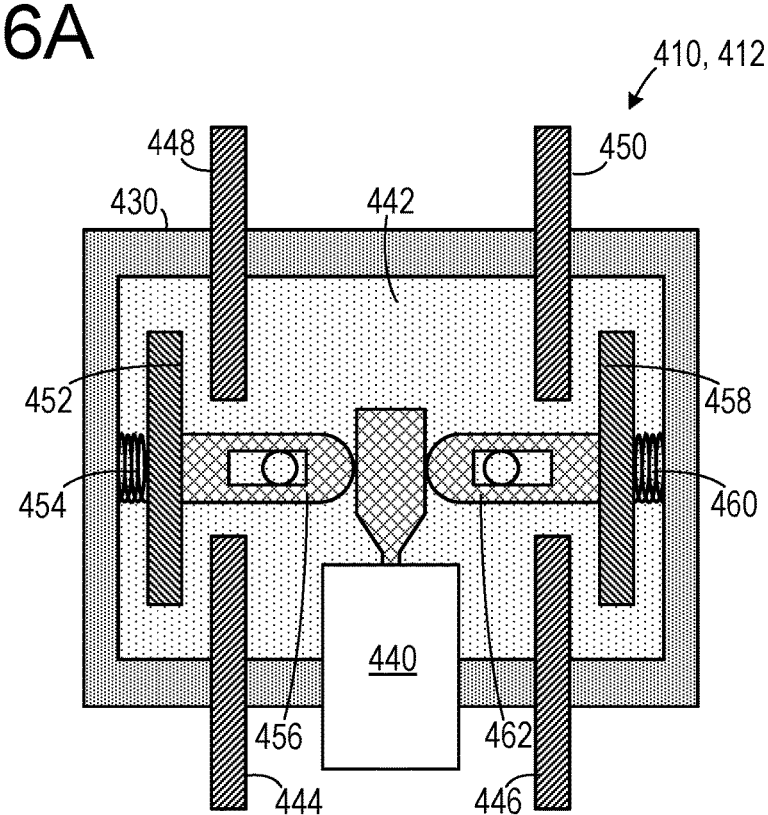

As shown in FIGS. 6A-6B, one embodiment of a power breaker 410, 412 used to couple the grid power to the load through the meter includes a housing 430, which in one embodiment includes an injection-molded plastic. A first base contact 444 and a second base contact 446 are held in a fixed relationship with the housing 430. Similarly, a first meter contact 448 and a second meter contact 450 are held in a fixed relationship with the housing. A first moving contact 452 is in a movable relationship with the housing 430 and is movable between contacting both the first base contact 444 and the first meter contact 448, thereby selectively electrically coupling the first base contact 444 to the first meter contact 448. A first spring 454 pushes the first moving contact 452 toward the first base contact 444 and the first meter contact 448. A first arm 456 is in sliding relationship along a first direction relative to the housing 430 and is coupled to the first moving contact 452. Similarly, a second moving contact 458 is in a movable relationship with the housing and movable between contacting both the second base contact 446 and the second meter contact 450, thereby selectively electrically coupling the second base contact 446 to the second load contact 450. A second spring 460 pushes the second moving contact 458 toward the second base contact 446 and the second meter contact 450. A second arm 462 is in sliding relationship along a second direction relative to the housing 430 and is coupled to the second moving contact 458.

A plunger 442 has a first position (as shown in FIG. 6A) which allows the first spring 454 to push the first moving contact 452 into a closed position that electrically couples first base contact 444 to the first meter contact 448 and that allows the second spring 460 to push the second moving contact 458 into a closed position that electrically couples second base 446 contact to the second meter contact 450. The plunger 442 also has a second position (as shown in FIG. 6B) which pushes the first arm 456 and the first moving contact 452 into an open position that electrically decouples first base contact 444 from the first meter contact 448 and that pushes the second arm 462 and the second moving contact 458 into an open position that electrically decouples second base contact 446 from the second meter contact 450. A driving mechanism 440 (which, in certain embodiments can a rack and pinion system 420 of the type shown in FIGS. 4 and 5A-5C), selectively moves the plunger 442 between the first position and the second position.

Figure 7A:
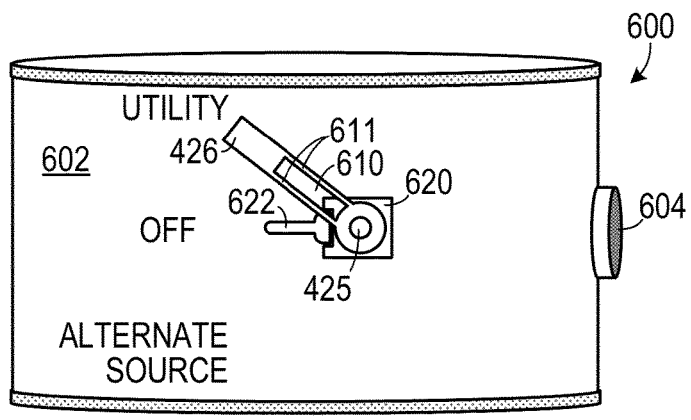
FIGS. 7A-7C are elevational views of an intermediate disconnect section in different states.
Figure 7B:
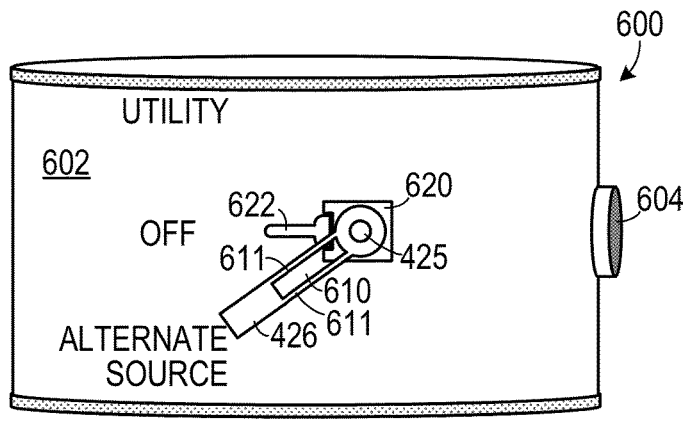
Figure 7C:
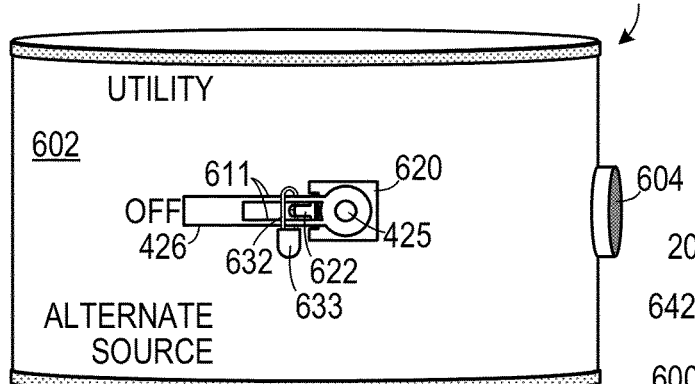

As shown in FIGS. 7A-7C, one embodiment of an intermediate disconnect section 600 includes a utility power breaker and an alternate source power breaker (of the type shown in FIGS. 4 and 5A-5C) supported in a frame 602. The rod 425 from the pinion device 424 extends through the frame 602 and supports a lever 426, which a user moves to change the states of the power breakers. The lever 426 has three positions including: a "utility" position, which puts the power breakers in a state in which the load is connected to the utility power source; an "alternate source" position, which puts the power breakers in a state in which the load is connected to the alternate power source (such as, e.g., a solar power source, a wind generator power source or a local generator power source); and an "off" position, which disconnects the load from both power sources.

Figure 8A:
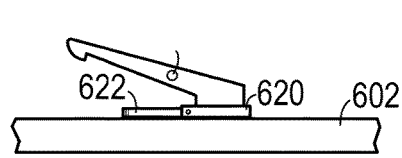
FIGS. 8A-8B are details of a locking device.
Figure 8B:
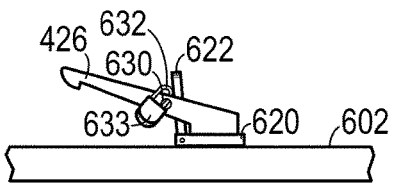

A locking device is used to secure the lever 426 it is in the off position. This would typically be used when electrical work is being conducted on the load or during emergency situations where emergency workers (e.g., firefighters) might come into contact with the load wiring. In one embodiment, as shown in FIGS. 7A-7B and 8A-8B, the locking device includes a key base 620 that is attached to the frame 602 and that has an end portion 622 hingedly attached to the key base 620. The end portion 622 can move from a down position (as shown in FIG. 8A) to an upward position (as shown in FIG. 8B). In this embodiment, the lever 426 defines a lever opening 610 that is bounded by two oppositely-disposed walls 611.

The end portion 622 has a key width that is narrower than the width of the opening 610 so that when the lever 426 is in the off position (as shown in FIG. 7C), the end portion 622 is rotatable so as to extend outwardly through the lever opening 610. Each of the two oppositely-disposed walls 611 defines a hole 630 passing therethrough and the holes 630 are aligned with each other. A locking pin 632 can be passed through the holes 630 thereby keeping the key end portion 622 extended through the lever opening 610, which prevents the lever 426 from exiting the off position. An indictor tab 633 can be used to secure the pin 632 and indicate that the lever 426 is secured in the off position.

Figure 9:
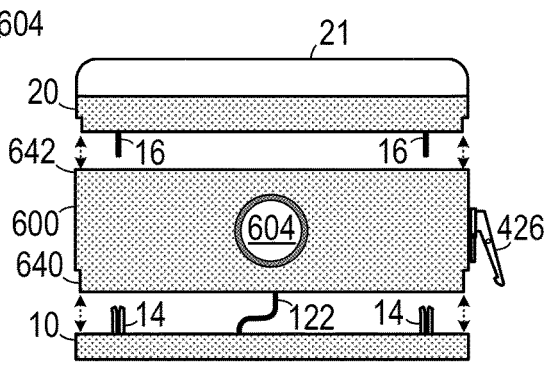
FIG. 9 is an exploded view of a meter base, and intermediate disconnect section and a meter.

As shown in FIG. 9, the frame 602 can include a cylindrical casing (typically made of a suitable plastic) with an alternate power source port 604 for connecting a cable from the alternate power source. The cylindrical casing includes a first end shape 640 that is complementary to a mating surface of the meter base 10 and a second end shape 642 that is complementary to a mating surface of the electricity meter 20.

Figure 10A:
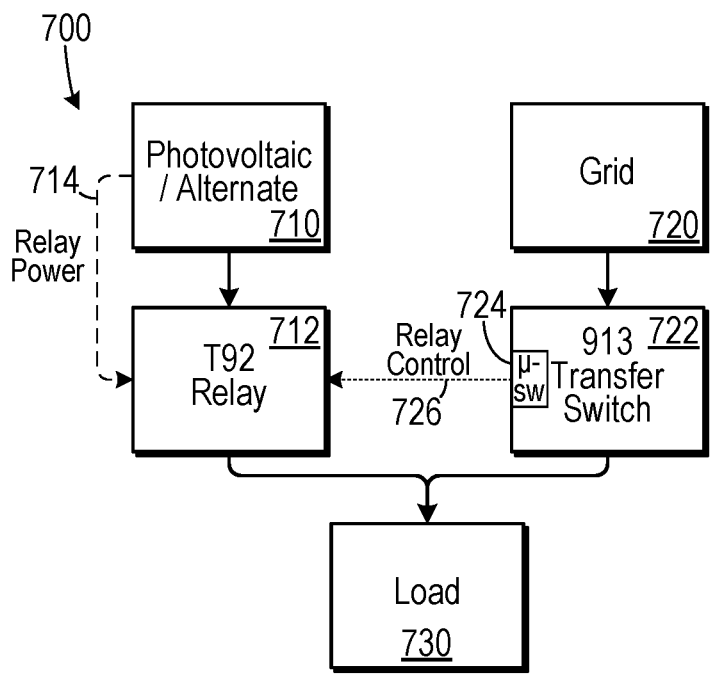
FIG. 10A is a block diagram of a switch-based disconnect circuit embodiment.
Figure 10B:
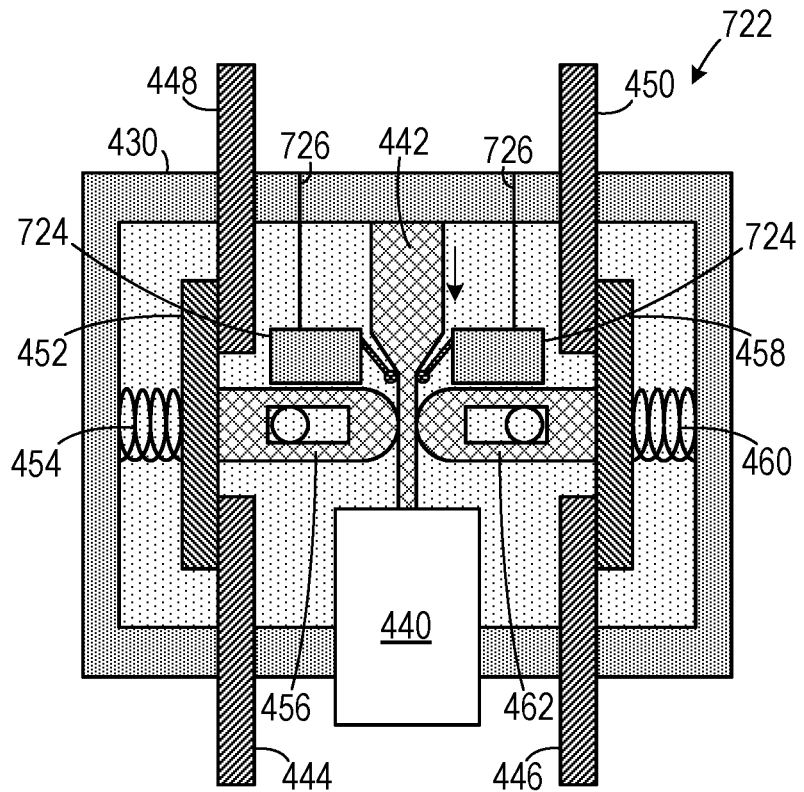
FIG. 10B is schematic diagram of a 913-type transfer switch.

In one embodiment, as shown in FIGS. 10A and 10B, a mechanism that works in place of the circuit breakers employs a relay 712 (such as a T92 relay rated at 30 to 50 amps) that selectively couples the alternate source 710 to the load 730. The relay 712 receives state control power from a relay power line 714. The utility grid power source 720 is selectively couplable to the load 730 through a transfer switch (such as a 913 transfer switch, as shown in FIG. 10B) that includes at least one state-indicating microswitch 724 (a typical the transfer switch will have two microswitches). The microswitch 724 indicates whether the transfer switch 722 is in an open state or a closed state. A relay control line 724 causes the relay 712 to couple the alternate source 710 to be coupled to the load 730 only when the microswitch 724 indicates that the transfer switch 722 is in the open state, which indicates that the utility grid power source 720 is decoupled from the load. This embodiment may be preferable for homes having a photovoltaic alternate power source with a battery backup option.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not. Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above-described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An intermediate disconnect section mountable on a meter base having a source connector coupled to a load, the intermediate disconnect section configured to receive a meter, for use with a utility power source and an alternate power source, the intermediate disconnect section comprising: (a) a utility power breaker having a closed state in which the utility power source is coupled to the source connector of the meter base through the meter and an open state in which the utility power source decoupled from the source connector of the meter base; (b) an alternate power breaker having a closed state in which the alternate power source is coupled to the source connector of the meter base; (c) a switching mechanism that selectively opens and closes the utility power breaker and that selectively opens and closes the alternate power breaker, so as to be in exactly one of a first state, a second state or a third state, in which the utility power breaker is closed and the alternate power breaker is open while in the first state; the utility power breaker is open and the alternate power breaker is closed while in the second state; and the utility power breaker is open and the alternate power breaker is open while in the third state; wherein the meter base has a source connector that includes two sockets each coupled to a wiring system corresponding to a different phase of a power source, wherein the meter base load connector includes two sockets each coupled to a wiring system corresponding to a different phase of a load, wherein the electricity meter source connection includes two plugs, wherein the electricity meter load connection includes two plugs and wherein: (a) the first source coupling comprises two plugs; (b) the second source coupling comprises two sockets; (c) the first load coupling comprises two plugs; and (d) the second load coupling comprises two sockets; wherein the switching mechanism comprises: (a) a rack that is coupled to both the utility power breaker and the alternate power breaker, the rack having: a first position in which the switching mechanism is in the first state; a second position in which the switching mechanism is in the second state; and a third position in which the switching mechanism is in the third state; (b) a pinion engaged with the rack that causes the rack to move to one of the first position, the second position and the third position; and (c) a lever coupled to the pinon that causes the pinon to rotate in response to a force applied thereto, the lever having a utility position that places the rack in the first position, an alternate source position that places the rack in the second position, and an off position that places the rack in the third state.

2. The intermediate disconnect section of claim 1, further comprising:
   (a) a frame that supports the utility power breaker, the alternate power breaker, the rack and the pinion;
   (b) a rod extending from the pinion and supporting the lever; and
   (c) a locking device that secures the lever when the lever is in the off position.

3. The intermediate disconnect section of claim 2, wherein the lever has an elongated portion that defines a lever opening having an opening width and running along a length of the elongated portion so as to be bounded by two oppositely-disposed walls, each of the two oppositely-disposed walls defining a hole passing therethrough in which the holes are aligned with each other, the locking device comprising:
   (a) a key hingedly attached to the frame, the key having an end portion that has a key width that is narrower than the opening width, the key positioned so that the end portion is rotatable so as to extend outwardly through the lever opening when the lever is in the off position; and
   (b) a pin that passes through the holes so as to keep the key extended outwardly through the lever opening, thereby preventing the lever from exiting the off position.

4. The intermediate disconnect section of claim 3, wherein the pin includes an indictor tab that indicates that the lever is secured in the off position.

5. The intermediate disconnect section of claim 2, wherein the frame comprises a cylindrical casing.

6. The intermediate disconnect section of claim 5, wherein the cylindrical casing includes a utility position marking, an off position marking and an alternate source position marking, the utility position marking disposed so as to indicate that the lever is in the utility position when the lever points thereto, the off position marking disposed so as to indicate that the lever is in the off position when the lever points thereto and the alternate source position marking disposed so as to indicate that the lever is in the alternate source when the lever points thereto.

7. The intermediate disconnect section of claim 5, wherein the cylindrical casing includes a first end shape that is complementary to a mating surface of the meter base and a second end shape that is complementary to a mating surface of the meter.

8. An intermediate disconnect section mountable on a meter base having a source connector coupled to a load, the intermediate disconnect section configured to receive a meter, for use with a utility power source and an alternate power source, the intermediate disconnect section comprising:
   (a) a utility power breaker having a closed state in which the utility power source is coupled to the source connector of the meter base through the meter and an open state in which the utility power source decoupled from the source connector of the meter base;
   (b) an alternate power breaker having a closed state in which the alternate power source is coupled to the source connector of the meter base;
   (c) a switching mechanism that selectively opens and closes the utility power breaker and that selectively opens and closes the alternate power breaker, so as to be in exactly one of a first state, a second state or a third state, in which the utility power breaker is closed and the alternate power breaker is open while in the first state; the utility power breaker is open and the alternate power breaker is closed while in the second state; and the utility power breaker is open and the alternate power breaker is open while in the third state;
   (d) a frame that supports the utility power breaker, the alternate power breaker, a rack and a pinion;
   (e) a rod extending from the switching mechanism and supporting a lever; and
   (f) a locking device that secures the lever when the locking mechanism is in the third state, the lever having an elongated portion that defines a lever opening having an opening width and running along a length of the elongated portion so as to be bounded by two oppositely-disposed walls, each of the two oppositely-disposed walls defining a hole passing therethrough in which the holes are aligned with each other, the locking device including:
      (i) a key hingedly attached to the frame, the key having an end portion that has a key width that is narrower than the opening width, the key positioned so that the end portion is rotatable so as to extend outwardly through the lever opening when the lever is in the off position; and
      (ii) a pin that passes through the holes so as to keep the key extended outwardly through the lever opening, thereby preventing the lever from exiting the off position.

9. The intermediate disconnect section of claim 8, wherein the meter base has a source connector that includes two sockets each coupled to a wiring system corresponding to a different phase of a power source, wherein the meter base load connector includes two sockets each coupled to a wiring system corresponding to a different phase of a load, wherein the electricity meter source connection includes two plugs, wherein the electricity meter load connection includes two plugs and wherein:
   (a) the first source coupling comprises two plugs;
   (b) the second source coupling comprises two sockets;
   (c) the first load coupling comprises two plugs; and
   (d) the second load coupling comprises two sockets.

10. The intermediate disconnect section of claim 8, wherein the switching mechanism comprises:
    (a) the rack that is coupled to both the utility power breaker and the alternate power breaker, the rack having: a first position in which the switching mechanism is in the first state; a second position in which the switching mechanism is in the second state; and a third position in which the switching mechanism is in the third state;
    (b) the pinion engaged with the rack that causes the rack to move to one of the first position, the second position and the third position; and
    (c) a lever coupled to the pinon that causes the pinon to rotate in response to a force applied thereto, the lever having a utility position that places the rack in the first position, an alternate source position that places the rack in the second position, and an off position that places the rack in the third state.

11. The intermediate disconnect section of claim 8, wherein the pin includes an indictor tab that indicates that the lever is secured in the off position.

12. The intermediate disconnect section of claim 8, wherein the frame comprises a cylindrical casing.

13. The intermediate disconnect section of claim 12, wherein the cylindrical casing includes a utility position marking, an off position marking and an alternate source position marking, the utility position marking disposed so as to indicate that the lever is in the utility position when the lever points thereto, the off position marking disposed so as to indicate that the lever is in the off position when the lever points thereto and the alternate source position marking disposed so as to indicate that the lever is in the alternate source when the lever points thereto.

14. The intermediate disconnect section of claim 12, wherein the cylindrical casing includes a first end shape that is complementary to a mating surface of the meter base and a second end shape that is complementary to a mating surface of the meter.

15. An intermediate disconnect section mountable on a meter base having a source connector coupled to a load, the intermediate disconnect section configured to receive a meter, for use with a utility power source and an alternate power source, the intermediate disconnect section comprising:
    (a) a utility power breaker having a closed state in which the utility power source is coupled to the source connector of the meter base through the meter and an open state in which the utility power source decoupled from the source connector of the meter base;
    (b) an alternate power breaker having a closed state in which the alternate power source is coupled to the source connector of the meter base; and
    (c) a switching mechanism that selectively opens and closes the utility power breaker and that selectively opens and closes the alternate power breaker, so as to be in exactly one of a first state, a second state or a third state, in which the utility power breaker is closed and the alternate power breaker is open while in the first state; the utility power breaker is open and the alternate power breaker is closed while in the second state; and the utility power breaker is open and the alternate power breaker is open while in the third state, the switching mechanism including:

(i) a rack that is coupled to both the utility power breaker and the alternate power breaker, the rack having: a first position in which the switching mechanism is in the first state; a second position in which the switching mechanism is in the second state; and a third position in which the switching mechanism is in the third state;

(ii) a pinion engaged with the rack that causes the rack to move to one of the first position, the second position and the third position; and (iii) a lever coupled to the pinon that causes the pinon to rotate in response to a force applied thereto, the lever having a utility position that places the rack in the first position, an alternate source position that places the rack in the second position, and an off position that places the rack in the third position.

16. The intermediate disconnect section of claim 15, further comprising:

(a) a frame that supports the utility power breaker, the alternate power breaker, the rack and the pinion;

(b) a rod extending from the pinion and supporting the lever; and (c) a locking device that secures the lever when the locking mechanism is in the third state, wherein the lever has an elongated portion that defines a lever opening having an opening width and running along a length of the elongated portion so as to be bounded by two oppositely-disposed walls, each of the two oppositely-disposed walls defining a hole passing therethrough in which the holes are aligned with each other, the locking device including:

(i) a key hingedly attached to the frame, the key having an end portion that has a key width that is narrower than the opening width, the key positioned so that the end portion is rotatable so as to extend outwardly through the lever opening when the lever is in the off position; and (ii) a pin that passes through the holes so as to keep the key extended outwardly through the lever opening, thereby preventing the lever from exiting the off position.

17. The intermediate disconnect section of claim 16, wherein the pin includes an indictor tab that indicates that the lever is secured in the off position.

18. The intermediate disconnect section of claim 16, wherein the frame comprises a cylindrical casing, wherein the cylindrical casing includes a utility position marking, an off position marking and an alternate source position marking, the utility position marking disposed so as to indicate that the lever is in the utility position when the lever points thereto, the off position marking disposed so as to indicate that the lever is in the off position when the lever points thereto and the alternate source position marking disposed so as to indicate that the lever is in the alternate source when the lever points thereto and wherein the cylindrical casing includes a first end shape that is complementary to a mating surface of the meter base and a second end shape that is complementary to a mating surface of the meter.

* * * * *